United States Patent
Zhang et al.

(10) Patent No.: US 10,524,351 B2
(45) Date of Patent: Dec. 31, 2019

(54) PRINTED CIRCUIT BOARD (PCB) WITH STUBS COUPLED TO ELECTROMAGNETIC ABSORBING MATERIAL

(71) Applicant: QUALCOMM Incorporated, San Diego, CA (US)

(72) Inventors: Yu Zhang, Cary, NC (US); Douglas Bruce White, Clayton, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/214,745

(22) Filed: Dec. 10, 2018

(65) Prior Publication Data

US 2019/0208619 A1    Jul. 4, 2019

Related U.S. Application Data

(60) Provisional application No. 62/612,949, filed on Jan. 2, 2018.

(51) Int. Cl.
*H05K 1/02* (2006.01)
*H05K 9/00* (2006.01)
(Continued)

(52) U.S. Cl.
CPC ......... *H05K 1/0218* (2013.01); *H05K 1/0234* (2013.01); *H05K 1/0298* (2013.01);
(Continued)

(58) Field of Classification Search
CPC .. H05K 1/0233; H05K 1/0234; H05K 1/0246; H05K 1/0222; H05K 1/116;
(Continued)

(56) References Cited

U.S. PATENT DOCUMENTS

| | | | | |
|---|---|---|---|---|
| 5,179,381 A | * | 1/1993 | Hatakeyama | .......... H01Q 17/00 342/1 |
| 6,175,506 B1 | * | 1/2001 | Takeuchi | ............. H05K 1/0216 174/260 |

(Continued)

FOREIGN PATENT DOCUMENTS

DE    19816230 A1    10/1998

OTHER PUBLICATIONS

Data Sheet for "Cunning Microwave Corporation's C-RAM MT-30"; from website http://stores.cunningmicrowave-online-store.com/7-c-ram-mt-30-125-x-24-x-24/ (Year: 2019).*

(Continued)

*Primary Examiner* — Roshn K Varghese
(74) *Attorney, Agent, or Firm* — Loza & Loza, LLP/Qualcomm (57) ABSTRACT

Disclosed is a printed circuit board (PCB) including a set of stacked metallization layers separated by a set of stacked electrical-insulating layers, respectively, wherein the set of stacked metallization layers includes top metallization layer, bottom metallization layer, and intermediate metallization layer; a via electrically coupled to the top metallization layer, the intermediate metallization layer, and the bottom metallization layer, wherein the top metallization layer, a portion of the via between the top metallization layer and the intermediate metallization layer, and the intermediate metallization layer are configured to route a data signal between a signal-in and a signal-out; and an electromagnetic absorbing material configured to reduce an intensity of a reflected signal resulting from the data signal propagating downward along a stub of the via and reflecting off the bottom metallization layer. The electromagnetic absorbing material may be attached to a bottom of the PCB and/or coaxially attached to the stub.

24 Claims, 7 Drawing Sheets

(51) Int. Cl.
  *H05K 1/11*    (2006.01)
  *H05K 1/09*    (2006.01)
  *H05K 3/46*    (2006.01)
  *H05K 3/40*    (2006.01)
  *H05K 1/05*    (2006.01)

(52) U.S. Cl.
  CPC ............... *H05K 1/05* (2013.01); *H05K 1/09* (2013.01); *H05K 1/115* (2013.01); *H05K 3/4038* (2013.01); *H05K 3/46* (2013.01); *H05K 9/0075* (2013.01); *H05K 1/0251* (2013.01); *H05K 1/116* (2013.01); *H05K 2201/09663* (2013.01); *H05K 2201/10022* (2013.01)

(58) Field of Classification Search
  CPC .. H05K 1/0245; H05K 1/0251; H05K 1/0253; H05K 1/0242; H05K 2201/093; H05K 2201/09718; H05K 2201/09818; H05K 9/0081; H05K 9/0083; H05K 9/0084; H05K 9/0086; H05K 9/0088; H05K 1/0218; H05K 1/0298; H05K 1/09; H05K 1/115; H05K 9/0075
  See application file for complete search history.

(56) References Cited

U.S. PATENT DOCUMENTS

| | | | |
|---|---|---|---|
| 6,603,080 B2 * | 8/2003 | Jensen ................. | H05K 1/0233 174/255 |
| 7,204,701 B1 | 4/2007 | Balasingham et al. | |
| 8,158,892 B2 * | 4/2012 | Goergen ............. | H05K 1/0216 174/250 |
| 8,389,870 B2 * | 3/2013 | Bills ................. | H01L 23/49822 174/253 |
| 8,643,184 B1 * | 2/2014 | Zhang ..................... | H01P 3/081 257/758 |
| 9,351,394 B2 * | 5/2016 | Huang ................. | H05K 1/0234 |
| 2003/0190498 A1 * | 10/2003 | Fujieda ................. | H01L 23/552 428/8 |
| 2005/0205295 A1 * | 9/2005 | Tsuk ..................... | H05K 1/0233 174/256 |
| 2006/0237223 A1 * | 10/2006 | Chen .................... | H05K 1/0218 174/255 |
| 2006/0255876 A1 * | 11/2006 | Kushta ..................... | H01P 3/06 333/33 |
| 2007/0091581 A1 * | 4/2007 | Gisin ..................... | H05K 1/023 361/782 |
| 2007/0196671 A1 * | 8/2007 | Kobayashi ............. | B82Y 25/00 428/447 |
| 2009/0047507 A1 * | 2/2009 | Yoshida ............... | H05K 1/0233 428/332 |
| 2009/0133913 A1 * | 5/2009 | Kushta ............. | H01L 23/49827 174/260 |
| 2010/0321135 A1 * | 12/2010 | Kushta .................. | H01P 1/2088 333/228 |
| 2011/0203843 A1 * | 8/2011 | Kushta ................. | H05K 1/0219 174/377 |
| 2014/0034357 A1 * | 2/2014 | Lee ..................... | H05K 1/0242 174/251 |
| 2015/0366052 A1 | 12/2015 | Huang et al. | |
| 2019/0037709 A1 * | 1/2019 | Bartley ................ | H05K 3/4046 |

OTHER PUBLICATIONS

International Search Report and Written Opinion—PCT/US2018/064870—ISA/EPO—dated Mar. 26, 2019.

* cited by examiner

PRINTED CIRCUIT BOARD (PCB) WITH STUBS COUPLED TO ELECTROMAGNETIC ABSORBING MATERIAL

CROSS-REFERENCE TO RELATED APPLICATION

This application claims the benefit of the filing date of U.S. Provisional Application, Ser. No. 62/612,949, filed on Jan. 2, 2018, which is incorporated herein by reference.

FIELD

Aspects of the present disclosure relate generally to printed circuit boards (PCBs), and in particular, to a PCB with stubs coupled to electromagnetic absorbing material for reducing resonance effect that may adversely impact the transmission of a data signal through a PCB.

BACKGROUND

Printed circuit boards (PCBs) are used in many applications for routing signals between two or more devices. A typical PCB includes a set of stacked, horizontal metallization layers separated by a set of stacked, horizontal dielectric (electrically-insulating) layers, respectively. For manufacturing purposes, a PCB may further include a set of vertical metallized vias or simply vias (also known as plated-thru holes) electrically-connecting the top or upper metallization layer to the bottom or lower metallization layer.

Often a high-speed data signal (e.g., in the gigabits per second (Gbps) range) is routed through various metallization layers and a via from a transmitting device to a receiving device. As an example, the data signal may be routed through a top metallization layer, a metalized via, and an intermediate (e.g., third from the top) metallization layer. As a result of such construction, the portion of the via below the intermediate metallization layer, defined as a stub or non-signal-path portion of the via, is not actually needed for routing the signal, and often produces a resonance that adversely affects the data signal.

Accordingly, several PCB implementations are described herein that reduces the adverse effects on data signals as a result of such stubs.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a printed circuit board (PCB), comprising: a set of stacked metallization layers separated by a set of stacked electrical-insulating layers, respectively, wherein the set of stacked metallization layers includes upper metallization layer, lower metallization layer, and intermediate metallization layer; a via electrically coupled to the upper metallization layer, the intermediate metallization layer, and the lower metallization layer; and an electromagnetic absorbing material coupled to the via.

Another aspect of the disclosure relates to a method of manufacturing a printed circuit board (PCB), including: forming a set of stacked metallization layers separated by a set of stacked electrical-insulating layers, respectively, wherein the set of stacked metallization layers includes upper metallization layer, lower metallization layer, and intermediate metallization layer; forming a via electrically coupled to the upper metallization layer, the intermediate metallization layer, and the lower metallization layer, wherein the upper metallization layer, a portion of the via between the upper metallization layer and the intermediate metallization layer, and the intermediate metallization layer are configured to route a data signal between a signal-in and a signal-out; and forming an electromagnetic absorbing material configured to reduce an intensity of a reflected signal resulting from the data signal propagating downward along a stub of the via and reflecting off the lower metallization layer.

Another aspect of the disclosure relates to apparatus including a first device configured to generate a data signal; a second device configured to receive the data signal; and a printed circuit board (PCB) including a set of stacked metallization layers separated by a set of stacked electrical-insulating layers, respectively, wherein the set of stacked metallization layers includes upper metallization layer, lower metallization layer, and intermediate metallization layer, a via electrically coupled to the upper metallization layer, the intermediate metallization layer, and the lower metallization layer, wherein the upper metallization layer, a portion of the via between the upper metallization layer and the intermediate metallization layer, and the intermediate metallization layer are configured to route the data signal from the first device to the second device, and an electromagnetic absorbing material configured to reduce an intensity of a reflected signal resulting from the data signal propagating downward along a stub of the via and reflecting off the lower metallization layer.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
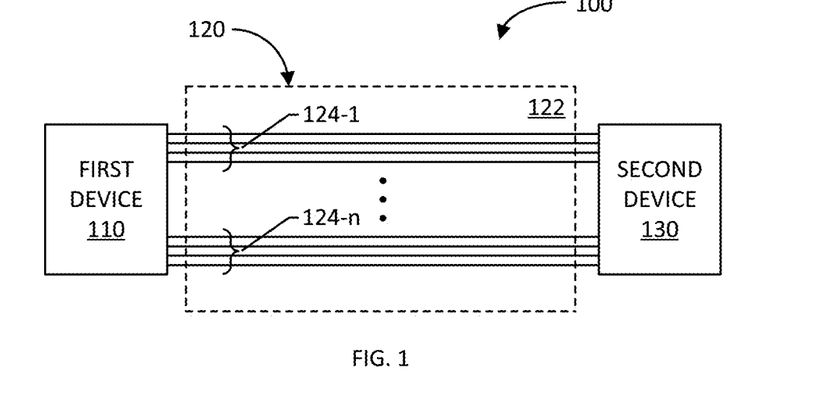
FIG. 1 illustrates a block diagram of an exemplary data communication system in accordance with an aspect of the disclosure.

FIG. 1 illustrates a block diagram of an exemplary data communication system 100 in accordance with an aspect of the disclosure. As an example, the data communication system 100 may pertain to a Peripheral Component Interconnect Express (PCI-e), a Double Data Rate (DDR) 4 memory interface, or other type of data transmission system. In this example, the data communication system 100 includes a first device 110, a second device 130, and a data communication medium 120 coupling the first device 110 to the second device 130.

In this example, the data communication medium 120 includes a printed circuit board (PCB) 122 with a set of data communication lanes 124-1 to 124-n. As an example, if each of the data communication lanes 124-1 to 124-n is configured in accordance with a PCI-e format, each data communication lane includes a first pair of electrical conductors for routing a differential serial data signal from the first device 110 to the second device 130, and a second pair of electrical conductors for routing a differential serial data signal from the second device 130 to the first device 110. It shall be understood that depending on the data communication system, the data communication lane may be configured differently, such as for unidirectional data communication, data communication via single-ended signals, or parallel data communication.

Figure 2:
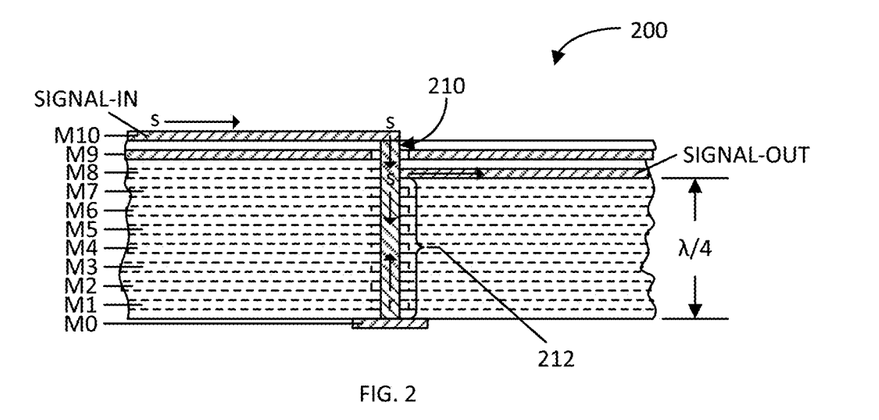
FIG. 2 illustrates a cross-sectional view of an exemplary printed circuit board (PCB) in accordance with another aspect of the disclosure.

FIG. 2 illustrates a cross-sectional view of an exemplary printed circuit board (PCB) 200 in accordance with another aspect of the disclosure. The PCB 200 may be an exemplary detailed implementation of the PCB 122 of data communication system 100.

The PCB 200 includes a set of stacked, horizontal metallization layers M0 to M10 separated from each other by a set of dielectric (electrically-insulating) layers, respectively. The metallization layer M0 is situated at the bottom of the PCB 200, and the metallization layer M10 is situated at the top of the PCB 200. The remaining metallization layers M1 to M9 are intermediate metallization layers vertically stacked in order from the bottom metallization layer M0 towards the top metallization layer M10. Although in this example the PCB 200 has 11 metallization layers M0 to M10, it shall be understood that the PCB 200 may have a different number of metallization layers.

The PCB 200 further includes a set of vertical metallized vias 210 (one shown for ease of illustration) electrically connecting the top metallization layer M10 to the bottom metallization layer M0. Often, the metallization layers and the vias are used to route a data signal from an originating device (e.g., the first device 110) to a destination device (e.g., the second device 130). In the illustrated example, a data signal "s" is routed from a signal-in region of the top metallization layer M10 to a signal-out region of one of the intermediate metallization layers (e.g., layer M8) via an upper portion of the via 210. In many cases, it may be desirable to route data signals via upper metallization layers, such as metallization layers M10 and M8 as illustrated.

At least a portion of intermediate metallization layer M9 below the top metallization layer M10 and above the intermediate metallization layer M8 serves as a ground plane to configure the signal routing path from the signal-in to the signal-out essentially as a microstrip. It shall be understood that the signal routing path along the PCB 200 may be configured in other manners, such as a stripline, coplanar microstrip, suspended microstrip, as well as others. As an example, if configured as a stripline, a data signal intermediate metallization layer is situated above and below two ground plane intermediate metallization layers. A coplanar microstrip has two ground planes on either side of a data signal metallization trace, all formed on the same metallization layer. A suspended microstrip has a ground plane that may be several layers below or above a data signal metallization trace.

In this configuration, a portion 212 of the via 210 below the intermediate metallization layer M8, referred to herein as a stub, serves no signal routing purposes, and, in fact, may produce an adverse resonance effect on the data signal "s" being routed. For instance, if the length of the stub 212 between the intermediate metallization layer M8 and the bottom metallization layer M0 is a quarter wavelength (214)

at a frequency that falls within the spectrum of the data signal "s", the data signal "s" exhibits a notch at such particular frequency.

Figure 11:
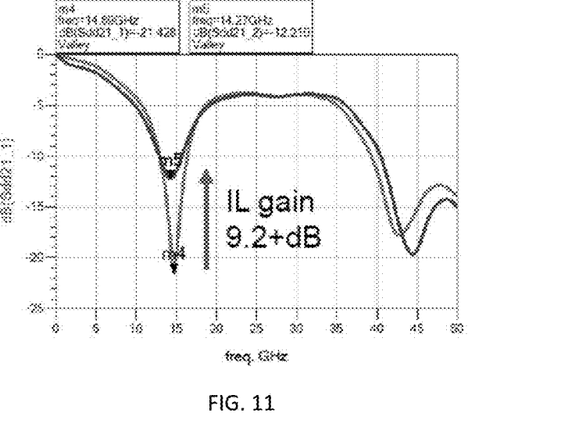
FIG. 11 illustrates a graph of insertion loss over frequency for printed circuit boards (PCBs) with unterminated and terminated stubs in accordance with another aspect of the disclosure.

FIG. 11 illustrates a graph of the insertion loss from the signal-in to the signal-out over frequency for the signal routing configuration of PCB 200. The y- or vertical axis represents the insertion loss ranging from 0 decibel (dB) at the top to −25 dB at the bottom of the graph. The x- or horizontal axis represents frequency of the data signal from 0 to 50 gigahertz (GHz). As illustrated, in this example, the quarter wavelength (214) length of the stub 212 between the intermediate metallization layer M8 and the bottom metallization layer M0 corresponds to a frequency of about 15 GHz, which produces an insertion loss notch labeled "m4" of over 20 dB between the signal-in and the signal-out.

In effect, a portion of the data signal "s" continues down the stub 212, and then reflects off the bottom metallization layer M0 to generate a reflected signal "r". The reflected signal "r" destructively combines with the data signal "s" at the junction of the intermediate metallization layer M8 and the via 210 to produce the insertion loss notch "m4". The notch "m4" has the further negative consequence of reducing or even closing the data eye of the data signal "s".

Figure 3:
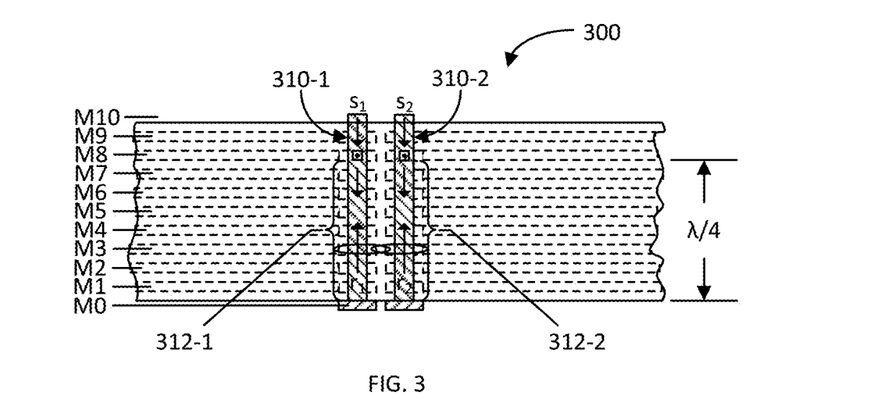
FIG. 3 illustrates a cross-sectional view of another exemplary printed circuit board (PCB) in accordance with another aspect of the disclosure.

FIG. 3 illustrates a cross-sectional view of another exemplary printed circuit board (PCB) 300 in accordance with another aspect of the disclosure. The PCB 300 may be a cross-section view of the PCB 200 vertically along the via 210 and viewed from the perspective of the signal-out looking towards the via 210. In this example, the PCB 300 includes a pair of vias 310-1 and 310-2 extending from the top metallization layer M10 to the bottom metallization layer M0 of the PCB 300.

A pair of signals "s1" and "s2" are routed from the top metallization layer M10 to a pair of separate metallization traces at layer M8 (represented as squares with dots therein) via upper portions of the vias 310-1 to 310-2, respectively. The pair of signals "s1" and "s2" may be separate single-ended signals, or positive and negative components of a differential signal, or a component of a first differential signal and a component of a second differential signal. As such, the signals "s1" and "s2" may somehow be related such that the positioning of the vias 310-1 and 310-2 are relatively close to each other.

As illustrated, portions of the signals "s1" and "s2" travel down stubs 312-1 and 312-2 of vias 310-1 and 310-2, and reflects off the separate bottom metallization layer pads M0 to produce reflected signals "r1" and "r2", respectively. As illustrated, the reflected signals "r1" and "r2" produce electromagnetic fields as represented by the ellipses around the reflected signals "r1" and "r2". Because the stubs 312-1 and 312-2 are reflectively close to each other, the electromagnetic fields produced by the reflected signals "r1" and "r2" interfere with each other. As a result, in addition to the adverse effects on the insertion loss and the data eye of the signals "s1" and "s2", another drawback of the stubs 312-1 and 312-2 is increased crosstalk between the signals "s1" and "s2" because of the mutually interfering electromagnetic fields.

Figure 4:
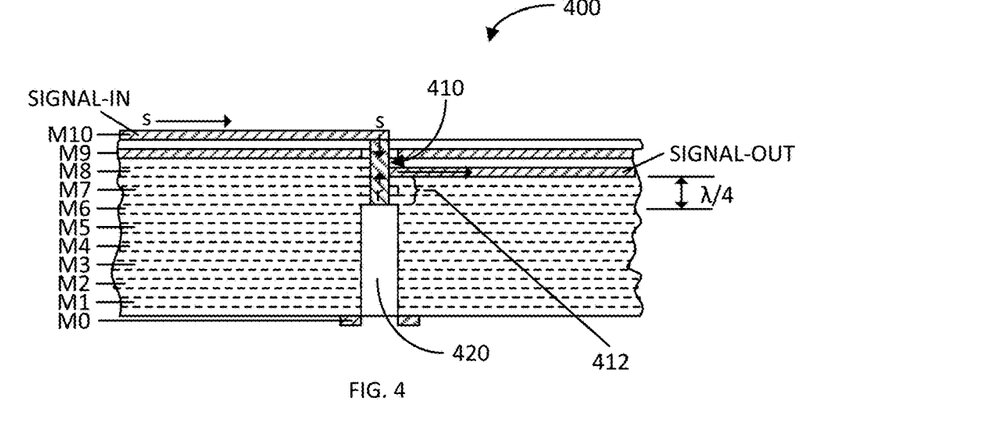
FIG. 4 illustrates a cross-sectional view of another exemplary printed circuit board (PCB) in accordance with another aspect of the disclosure.

FIG. 4 illustrates a cross-sectional view of another exemplary printed circuit board (PCB) 400 in accordance with another aspect of the disclosure. One solution for reducing the negative effects associated with such stubs is to shorten the stubs by back drilling. Back drilling is a process of shortening the stubs by drilling into the stubs from the bottom of the PCB to remove a defined length of the stubs. PCB 400 is an example of one that has undergone back drilling.

As illustrated, the PCB 400 includes via 410 with a stub 412 that has been shortened by back drilling. In this example, the stub 412 extends from the intermediate metallization layer M8 to a pre-defined distance below the intermediate metallization layer M8. In this example, the stub 412 extends to approximately the same level as intermediate metallization layer M6. As result of the back drilling, a cavity or bore 420 is formed below the stub 412 and extends to the bottom of the PCB 400. Accordingly, the quarter wavelength (λ/4) of the stub 412, being substantially shorter due to the back drilling, is associated with a much higher frequency. Thus, the back drilling of the stub 412 results in pushing the resulting insertion loss notch to a frequency above the spectrum of the data signal "s".

However, such back drilling makes the manufacturing of the PCB 400 complex, time-consuming, and expensive. In addition, because the vias 410 may be positioned close to each other to make efficient spatial use of the PCB footprint, the back drilling may not be possible because holes would run into each other and/or they would violate PCB manufacturing reliability rules.

Figure 5:
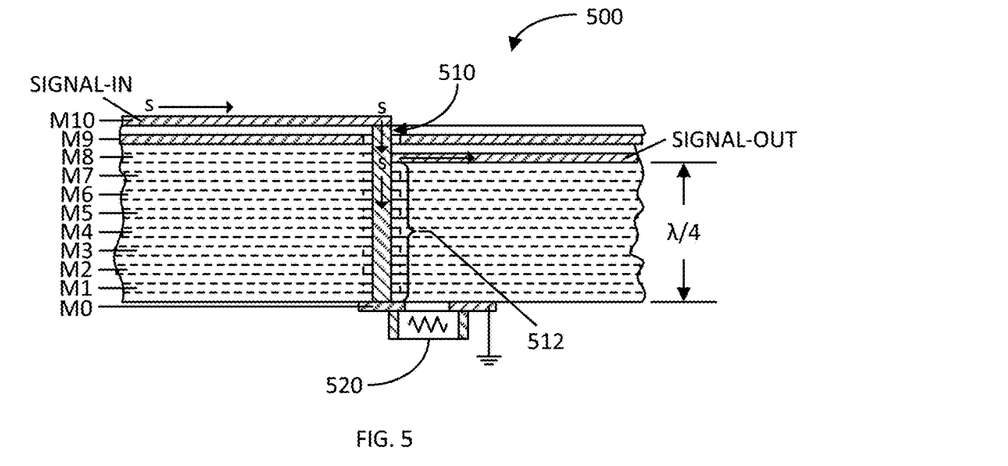
FIG. 5 illustrates a cross-sectional view of another exemplary printed circuit board (PCB) in accordance with another aspect of the disclosure.

FIG. 5 illustrates a cross-sectional view of another exemplary printed circuit board (PCB) 500 in accordance with another aspect of the disclosure. Another approach to reduce the adverse effects of stubs of a PCB is to add termination resistors to the end of the stubs at the bottom of the PCB in order to provide a load for the signal "s" propagating down the stubs. This reduces the intensity of the reflected signals so as to reduce the adverse effects on the data signals due to the reflected signals. PCB 500 is an example of one that has been configured per this approach.

In particular, PCB 500 includes a via 510 that extends from the top metallization layer M10 to the bottom metallization layer M0. As illustrated, a data signal "s" propagates from a signal-in to a signal-out by way of the top metallization layer M10, an upper portion of the via 510, and the intermediate metallization layer M8. As also illustrated, a portion of the data signal "s" travels down along a stub portion 512 of the via 510 towards the bottom metallization layer M0.

In this case, the PCB 500 further includes a chip resistor 520 with a first terminal electrically coupled to the lower end of the stub 512 at a pad of the bottom metallization layer M0, and a second terminal coupled to a grounded terminal at another pad of the bottom metallization layer M0. The chip resistor 520 functions as a termination load to sink the portion of the data signal "s" propagating down the stub 512 below the intermediate metallization layer M8. This reduces or eliminates the reflected signal to prevent adverse effects on the data signal "s" propagating towards the signal-out.

A drawback of the termination resistor approach is that the PCB 500 may include a large number of stubs. This would result in a large number of chip resistors that need to be installed on the PCB 500. Similar to the previous approach, this results in a complex, time-consuming, and costly manufacturing process for the PCB 500. Additionally, because of the spacing between adjacent stubs and the size of each chip resistors, there may not be sufficient PCB footprint to reliably or possibly install the needed chip resistors.

Figure 6:
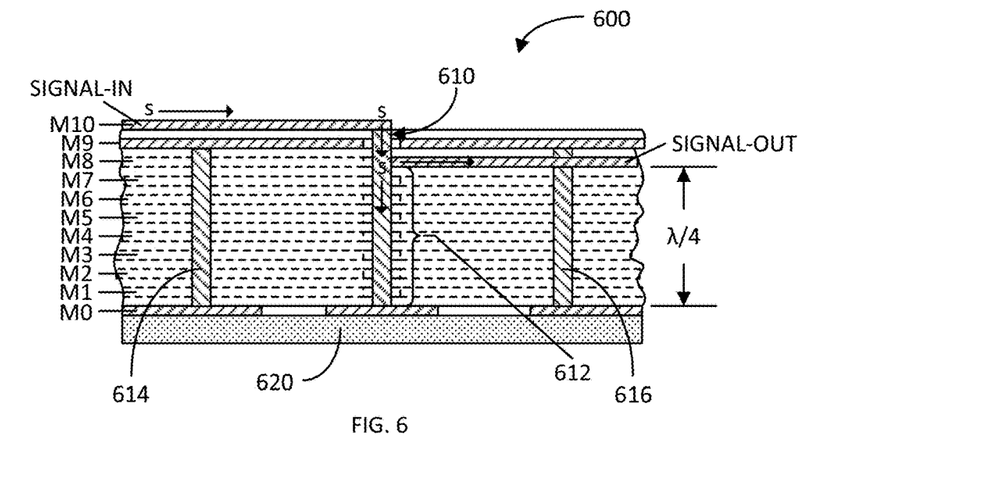
FIG. 6 illustrates a cross-sectional view of another exemplary printed circuit board (PCB) in accordance with another aspect of the disclosure.

FIG. 6 illustrates a cross-sectional view of another exemplary printed circuit board (PCB) 600 in accordance with another aspect of the disclosure. To eliminate or reduce an intensity of a reflected signal off the bottom end of a via 610, the PCB 600 includes an electromagnetic absorbing material 620 attached to the bottom of the PCB; and in particular, directly underneath a stub 612 of the via 610. As in the previous implementations, a data signal "s" propagates from a signal-in to a signal-out via the top metallization layer M10, an upper portion of the via 610, and the intermediate metallization layer M8. It shall be understood that the data signal "s" may travel in the opposite direction, in which case, the signal-in is the signal-out, and the signal-out is the signal-in. In either case, a portion of the data signal "s" travels down the stub 612 towards the bottom metallization layer M0.

In this case, the electromagnetic absorbing material 620 sinks (e.g., converts into heat) the portion of the data signal "s" that propagates down the stub 612 to the bottom metallization layer M0 so as to eliminate or substantially reduce the intensity of a reflected signal. As a result, the elimination or reduction in the intensity of the reflected signal produces less negative effects on the data signal "s" propagating towards the signal-out. In particular, the insertion loss notch that was previously associated with the uncompensated PCB 200 is substantially reduced as a result of the electromagnetic absorbing material 620.

This is shown in FIG. 11, where the insertion loss of the data signal "s" between the signal-in and the signal-out, includes an insertion loss notch labeled as "m5" that is about −11 dB at around 15 GHz, as compared to the insertion loss notch "m4" at about −21 dB. This is a substantial improvement in the insertion loss and also leads to a larger data eye as well as a reduction in crosstalk between adjacent stubs. As an example, the electromagnetic absorbing material 620 may be made out of a polystyrene electromagnetic absorbing material, such as materials MT-26 or MT-24 manufactured by Dutch Microwave Absorber Solutions (DMAS). It shall be understood that other types of materials may be used for the electromagnetic absorbing material 620.

Figure 12:
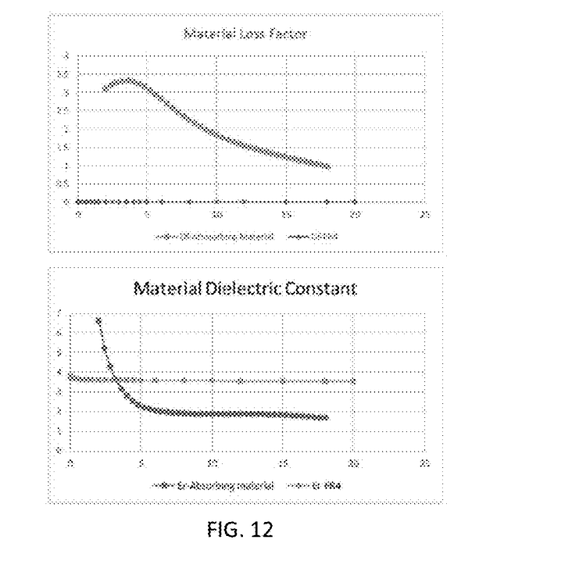
FIG. 12 illustrates respective graphs of material loss factor and material dielectric constant over frequency for dielectric and electromagnetic absorbing materials of a printed circuit board (PCB) in accordance with another aspect of the disclosure.

FIG. 12 illustrates a pair of graphs of the material loss factor and material dielectric constant over frequency for the electromagnetic absorbing material 620 and the dielectric (electrically-insulating) layers of the PCB 600. In this example, the electromagnetic absorbing material 620 is the MT-26 material by DMAS and the dielectric (electrically-insulating) material of the PCB 600 is FR-4, which is a composite material composed of woven fiberglass cloth with an epoxy resin binder that is flame resistant. It shall be understood that the dielectric (electrically-insulating) layers of the PCB 600 may include other types of electrical-insulating material.

The material loss factor graph has a y- or vertical axis that represents electromagnetic loss ranging from near zero (e.g., 0.018) at the bottom to four (4) at the top. The x- or horizontal axis represents frequency from 0 Hz to 25 GHz. The graph having diamond shape points indicates the material loss factor for the FR-4 dielectric (electrically-insulating) material of the PCB 600. The graph having circular points indicates the material loss factor for the MT-26 electromagnetic absorbing material 620.

As illustrated, the material loss factor of the FT-4 material is substantially flat at 0.014 or substantially very low loss across a frequency range from 0 Hz to 20 GHz. This is expected as it is desirable that the dielectric (electrically-insulating) layer of the PCB 600 has very low signal loss properties to minimize the loss of a data signal while the data signal propagates through the PCB 600. On the other hand, the material loss factor of the MT-26 material has a loss factor of 3-3.5 (~250× attenuation than FR4) at around 3-4 GHz and gradually decreases to about 1 (~70× attenuation than FR4) at around 18 GHz. The higher loss of the MT-26 material is desirable in order to sink the portion of the data signal "s" propagating down the stub 612 to the bottom metallization layer M0 to prevent or reduce a reflected signal that may cause adverse effects on the data signal "s" propagating from the signal-in to the signal-out.

The material dielectric constant graph has a y- or vertical axis that represents a dielectric constant ranging from 0 at the bottom to seven (7) at the top. The x- or horizontal axis represents frequency from 0 Hz to 25 GHz. The graph with square points indicates the dielectric constant for the FR-4 dielectric (electrically-insulating) material of the PCB 600. The graph with circular points indicates the dielectric constant for the MT-26 electromagnetic absorbing material 620.

As illustrated, the dielectric constant of the FR-4 material is substantially constant at about 3.5 over a frequency range of around 0 Hz to 20 GHz. The dielectric constant of the MT-26 material decreases dramatically from almost 7 to about 2 over a frequency range of about 2 GHz to 6 GHz, and remains substantially constant at around 2 over a frequency range from 6 GHz to 18 GHz. For reduction in the reflected signal generated, it is preferred that the dielectric constant of the electromagnetic absorbing material 620 is as close as possible to the dielectric constant of the dielectric (electrically-insulating) layer of the PCB 600. Here, the difference is about 1.5 in the frequency range of interest, which in many applications is acceptable.

The electromagnetic absorbing material 620 may be configured as a sheet of material attached to the bottom metallization layer M0 directly underneath a set of stubs 612 (although a single stub 612 is shown for ease of illustration purposes). As an example, the electromagnetic absorbing material 620 may have a thickness of about 0.5 millimeter (mm), which results in a 9.2 dB improvement in insertion loss and a 11 percent improvement in the data eye width. It shall be understood that the thickness and shape of the electromagnetic absorbing material 620 may be tuned for desired or optimal performance associated with insertion loss, data eye, and/or crosstalk.

Referring again to FIG. 6, the ground plane at intermediate metallization layer M9 may have ground vias or stubs 614 and 616 electrically connecting the ground plane to the bottom ground metallization layer M0. Accordingly, the electromagnetic absorbing material may also be attached to the bottom metallization layer M0 directly underneath the stubs 614 and 616.

Figure 7:
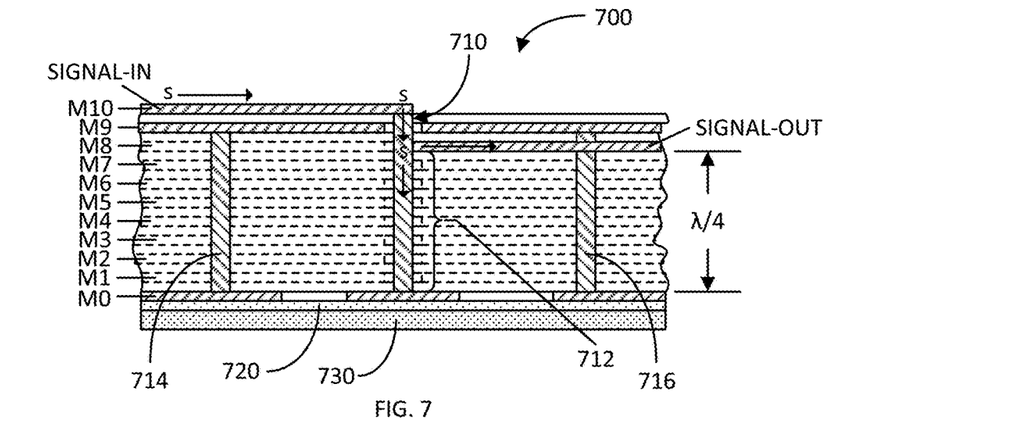
FIG. 7 illustrates a cross-sectional view of another exemplary printed circuit board (PCB) in accordance with another aspect of the disclosure.

FIG. 7 illustrates a cross-sectional view of another exemplary printed circuit board (PCB) 700 in accordance with another aspect of the disclosure. The PCB 700 is a variation of PCB 600. In particular, the PCB 700 includes a pair of stacked layers 720 and 730 attached to the bottom of the PCB 700; and in particular, to a region directly underneath a via 710 including a stub 712 (although in a more practical application, the stacked layers 720 and 730 extend continuously in the horizontal direction so that it is disposed directly underneath a set of stubs 712, such as ground vias or stubs 714 and 716 electrically connected to the ground plane on intermediate metallization layer M9 and bottom metallization layer M0.

The upper layer 720 of the stacked layers serves to produce a transitional impedance between the effective impedance of the stub 712 along the dielectric (electrical-insulating) material of the PCB 700 and the lower stacked layer 730. The lower layer 730 is an electromagnetic absorbing material similar to the electromagnetic absorbing layer 620 discussed above. To achieve the transitional impedance, the upper layer 720 may be configured to have a dielectric constant between the dielectric constant of the dielectric (electrically-insulating) layer of the PCB 700 and the electromagnetic absorbing material 730. As an example, if the dielectric (electrically-insulating) layer of the PCB 700 is FR-4 (which has a dielectric constant of around 3.5), and the electromagnetic absorbing material 730 is MT-26 (which has a dielectric constant of around 2), the upper layer 720 may be configured with a dielectric constant of around 2.8.

The transitional impedance function of the upper layer 720 produces a smoother impedance transition between the effective impedance of the stub 712 and that of the electromagnetic absorbing material 730. This results in a further reduction in the intensity of a reflected signal produced along the stub 712. As a result, the reflected signal, if any, has less adverse effect on the data signal "s" propagating from a signal-in to a signal-out via the top metallization layer M10, via 710, and intermediate metallization layer M8.

Figure 8:
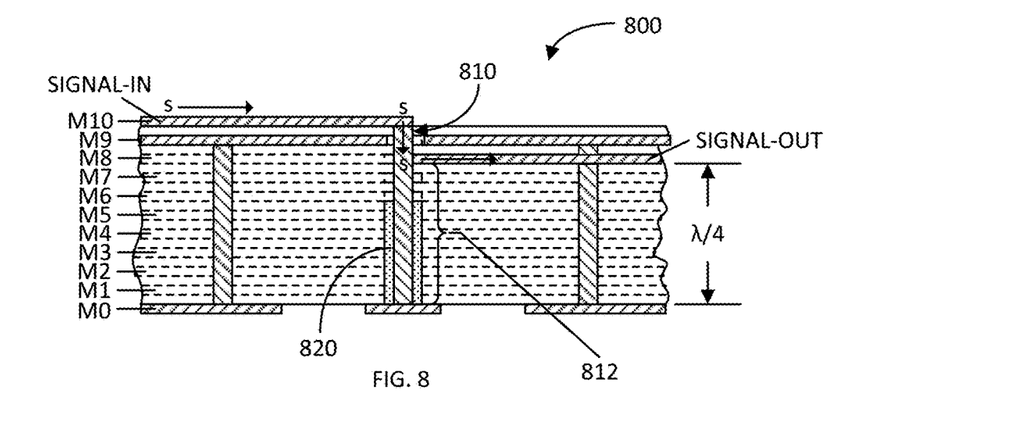
FIG. 8 illustrates a cross-sectional view of another exemplary printed circuit board (PCB) in accordance with another aspect of the disclosure.

FIG. 8 illustrates a cross-sectional view of another exemplary printed circuit board (PCB) 800 in accordance with another aspect of the disclosure. In this exemplary implementation, the PCB 800 includes an electromagnetic absorbing material 820 coaxially surrounding and attached to a portion of a stub 812 of a via 810 below the intermediate metallization layer M8. The electromagnetic absorbing material 820 may be configured similar to the other electromagnetic absorbing materials 620 and 730 described herein. As an example, the electromagnetic absorbing material 820 may be made out of a polystyrene electromagnetic absorbing material, such as materials MT-26 or MT-24 manufactured by DMAS.

The electromagnetic absorbing material 820 absorbs the portion of the data signal "s" that propagates down the stub 812 below the intermediate metallization layer M8. Thus, the electromagnetic absorbing material 820 sinks (e.g., converts into heat) the portion of the data signal "s" propagating via the stub 812 below the intermediate metallization layer M8 to reduce or eliminate any reflected signal that would otherwise result if the data signal "s" were to propagate to the bottom metallization layer M0 unabated. As an example, the thickness of the electromagnetic absorbing material 820 may be 20 micrometers (µm) and a length of 1.4 mm. It shall be understood that the length and thickness of the electromagnetic absorbing material 820 may be tuned for desirable or optimal performance when it comes to insertion loss, data eye, and/or crosstalk.

Again, this has the benefit of reducing the insertion loss of the data signal "s" as it propagates from the signal-in to the signal-out by way of the top metallization layer M10, upper portion of the via 810, and the intermediate metallization layer M8. Also, as discussed, additional benefits include wider data eye and less crosstalk between adjacent stubs. Although, in this example, only a single electromagnetic absorbing material 820 is shown coaxially around a portion of the stub 812, it shall be understood that the PCB 800 may include other stubs with corresponding electromagnetic absorbing material 820 in a like configuration.

Figure 9:
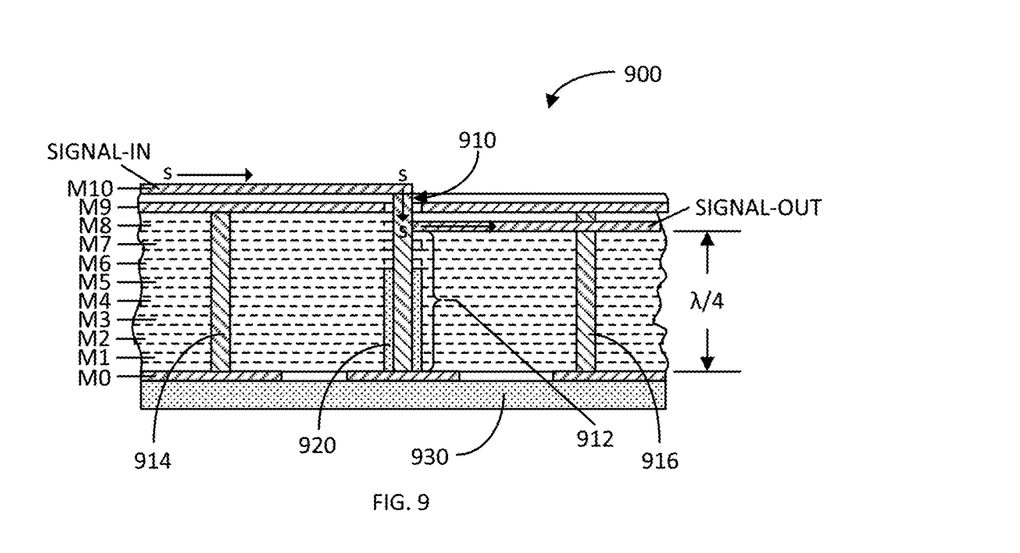
FIG. 9 illustrates a cross-sectional view of another exemplary printed circuit board (PCB) in accordance with another aspect of the disclosure.

FIG. 9 illustrates a cross-sectional view of another exemplary printed circuit board (PCB) 900 in accordance with another aspect of the disclosure. The PCB 900 is a combination of the prior embodiments of PCB 600 and 800. That is, the PCB 900 includes an electromagnetic absorbing material 920 coaxially surrounding and attached to a portion of a stub 912 of a via 910 below an intermediate metallization layer M8. Additionally, the PCB 900 includes an electromagnetic absorbing material 930 attached to the bottom of the PCB 900; and in particular, directly underneath the stub 912, as well as other stubs, including ground vias or stubs 914 and 916 electrically connected to the ground plane at intermediate metallization layer M9 and bottom metallization layer M0.

The electromagnetic absorbing materials 920 and 930 may be the same material (e.g., both made out of MT-26 or MT-24) or may be different materials. Again, if the PCB 900 includes a set of stubs, the PCB includes a set of electromagnetic absorbing material 920 coaxially attached to portions of the set of stubs, respectively. Additionally, the PCB 900 may include one or more electromagnetic absorbing material 930 attached to the bottom of the PCB directly underneath the set of stubs.

Figure 10:
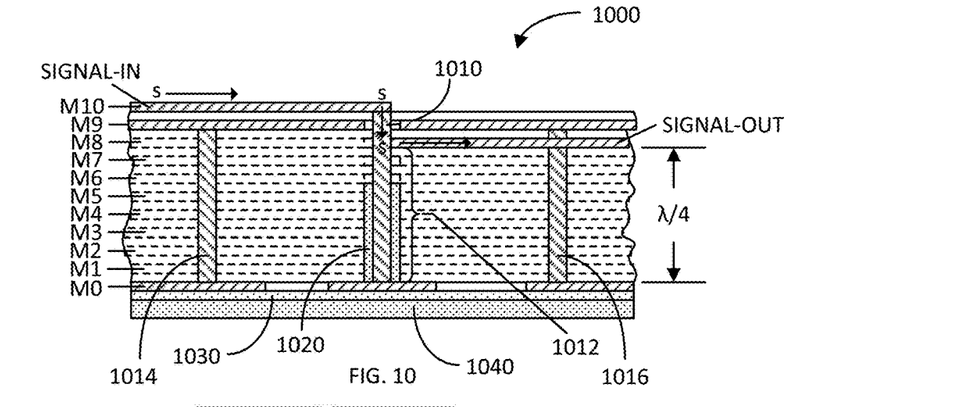
FIG. 10 illustrates a cross-sectional view of another exemplary printed circuit board (PCB) in accordance with another aspect of the disclosure.

FIG. 10 illustrates a cross-sectional view of another exemplary printed circuit board (PCB) 1000 in accordance with another aspect of the disclosure. The PCB 1000 is a combination of the implementations of PCB 700 and 800 described above. That is, the PCB 1000 includes an electromagnetic absorbing material 1020 coaxially surrounding and attached to a portion of a stub 1012 of a via 1010 below an intermediate metallization layer M8. Additionally, the PCB 1000 includes a set of stacked layers 1030 and 1040 attached to the bottom of the PCB 1000; and in particular, directly underneath the stub 1012, as well as other stubs, including the ground vias or stubs 1014 and 1016 electrically connected to the ground plane at intermediate metallization layer M9 and bottom metallization layer M0. The stacked layers include an impedance transitioning dielectric layer 1030 and an electromagnetic absorbing layer 1040. The impedance transitioning layer 1030 may have a dielectric constant between the dielectric constant of the dielectric (electrical-insulating) layer of the PCB 1000 and the dielectric constant of the electromagnetic absorbing layer 1040.

The electromagnetic absorbing materials 1020 and 1040 may be the same material (e.g., both made out of MT-26 or MT-24) or may be different materials. Again, if the PCB 1000 includes a set of stubs, a set of electromagnetic absorbing material 1020 coaxially surrounds portions of the set of stubs, respectively. Additionally, the PCB 1000 may include one or more stacked layers 1030 and 1040 attached to the bottom of the PCB directly underneath the set of stubs.

Figure 13A:
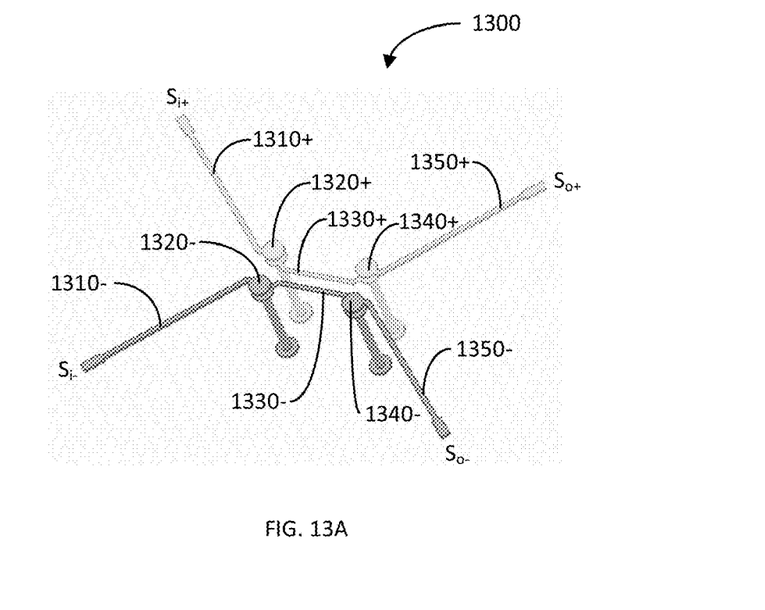
FIG. 13A illustrates a perspective view of an exemplary differential transmission line in accordance with another aspect of the disclosure.

FIG. 13A illustrates a perspective view of an exemplary differential transmission line 1300 in accordance with another aspect of the disclosure. The differential transmission line 1300 was used to verify the simulated frequency response of the differential transmission line with a via stub that has not been compensated with an inclusion of an electromagnetic absorbing material.

In particular, the differential transmission line 1300 includes positive and negative differential signal inputs $S_{i+}$ and $S_{i-}$ formed at respective first ends of a first pair of differential transmission lines 1310+ and 1310−, respectively. The first pair of transmission lines 1310+ and 1310− may be formed on a top or upper metallization layer of a printed circuit board (PCB). A first (transmitting) differential device (not shown) may be coupled to the differential signal inputs $S_{i+}$ and $S_{i-}$ of the first pair of differential transmission lines 1310+ and 1310−, respectively.

The differential transmission line 1300 further includes a first pair of differential metallized vias 1320+ and 1320− electrically connected to second ends of the first pair of differential transmission lines 1310+ and 1310−, respectively. The metallized vias 1320+ and 1320− extend downwards and make electrical contact to the bottom or lower metallization layer of the PCB.

The differential transmission line 1300 further includes a second pair of differential transmission lines 1330+ and 1330−, respectively. The second pair of transmission lines 1330+ and 1330− may be formed on an intermediate metallization layer of the PCB, i.e., a metallization layer between the top or upper metallization layer and the bottom or lower metallization layer. The second pair of transmission lines 1330+ and 1330− include first ends electrically connected to the first pair of differential metallized vias 1320+ and 1320−, respectively.

The differential transmission line 1300 further includes a second pair of differential metallized vias 1340+ and 1340− extending from the top or upper metallization layer to the bottom or lower metallization layer. The second pair of differential transmission lines 1330+ and 1330− include second ends electrically connected to second pair of differential metallized vias 1340+ and 1340−, respectively.

The differential transmission line 1300 further includes a third pair of differential transmission lines 1350+ and 1350−, respectively. The third pair of transmission lines 1350+ and 1350− may be formed on top or upper metallization layer of the PCB. The third pair of transmission liens 1350+ and 1350− include first ends electrically connected to the second pair of differential metallized vias 1340+ and 1340−, respectively. The third pair of differential transmission lines 1350+ and 1350− include second ends that may serve as differential signal outputs $S_{o+}$ and $S_{o-}$, respectively. A second (receiving) differential device (not shown) may be coupled to the differential signal outputs $S_{o+}$ and $S_{o-}$, respectively.

As the differential transmission line 1300 does not include an electromagnetic absorbing material coupled to the stubs of the metallized vias 1320+/1320− and 1340+/1340−, the transmission of a differential signal from the differential input $S_{i+}/S_{i-}$ to the differential output $S_{o+}/S_{o-}$ results in a notch in the frequency response of the differential transmission line 1300.

Figure 13B:
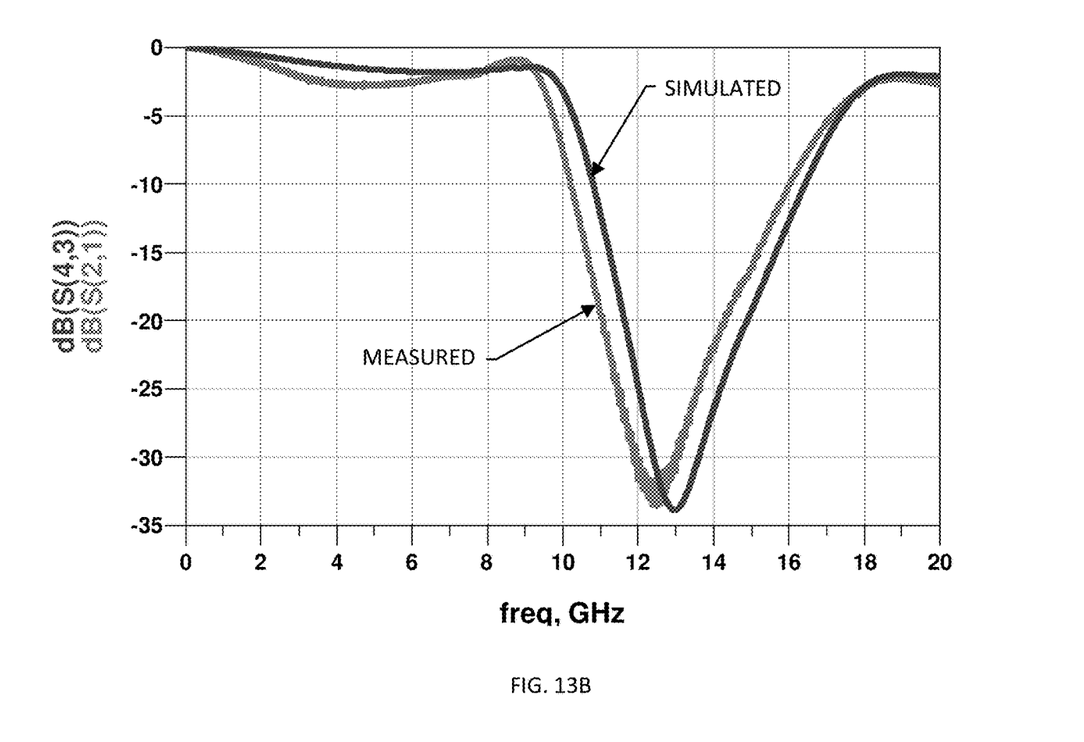
FIG. 13B illustrates a graph of exemplary simulated and measured frequency responses of the differential transmission line of FIG. 13A in accordance with another aspect of the disclosure.

FIG. 13B illustrates a graph of exemplary simulated and measured frequency response of the differential transmission line 1300 in accordance with another aspect of the disclosure. The y- or vertical-axis represents insertion loss from 0 dB at the top to −35 dB at the bottom of the scale. The x- or horizontal axis represents frequency from 0 Hz at the far left to 20 GHz at the far right.

The graph illustrates that the simulated frequency response of the differential transmission line 300 is substantially the same as its measured frequency response. Thus, the differential transmission line 300 has a substantially flat frequency response with about 0 to 2.5 dB of insertion loss between 0 to 9 GHz. Between 9 to 18 GHz, the frequency response of the differential transmission line 300 exhibits at notch with a peak insertion loss at around 13 GHz.

As discussed, the notch is due to the stubs below the attachments of the transmission lines 1330+ and 1330− to the vias 1320+/1320− and 1340+/1340−; producing a reflected differential signal off the bottom of the stub that propagates upwards along the stubs and deconstructively combines with the differential signal propagating from the signal input $S_{i+}/S_{i-}$ to the signal output $S_{o+}/S_{o-}$. As discussed, the use of an electromagnetic absorbing material coupled to the stubs of the differential transmission line 300 would substantially reduce the profoundness of the notch such that the frequency response of the transmission line 300 would not significantly affect the transmission of the differential signal from the signal input $S_{i+}/S_{i-}$ to the signal output $S_{o+}/S_{o-}$.

Figure 14:
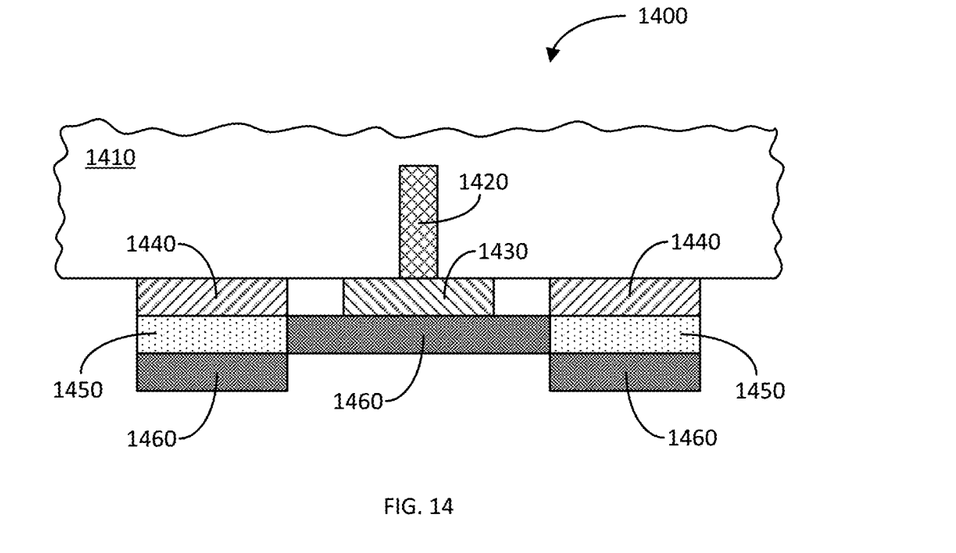
FIG. 14 illustrates a side sectional view of an exemplary printed circuit board (PCB) in accordance with another aspect of the disclosure.

FIG. 14 illustrates a side sectional view of an exemplary printed circuit board (PCB) 1400 in accordance with another aspect of the disclosure. In this example, the PCB 1400 is undergoing a process of forming an electromagnetic absorbing material along the bottom of a via stub as discussed.

The PCB 1400 includes a set of metallization layers interposed between a set of electrically-insulating layers, which, for ease of description purposes, is represented collectively as 1410. The PCB 1400 further includes a stub 1420 extending down to a metallization pad 1430, which may be on the lowest metallization layer (e.g., M0) of the PCB 1400. Additionally, the PCB 1400 includes one or more grounded metallization pads 1440, which may also be on the lowest metallization layer (e.g., M0) of the PCB 1400.

To form an electromagnetic absorbing material 1460 coupled to the stub 1420, a mask layer 1450 may be deposited and patterned over the ground pads 1440. Then, the electromagnetic absorbing material 1460 is formed over the metallization pad 1430, as well as over the mask layer 1450. As an example, the electromagnetic absorbing material 1460 may be sprayed over the bottom of the of the PCB 1400 to form the electromagnetic absorbing material over the metallization pad 1430 and mask layer 1450. For example, such sprayable electromagnetic absorbing material include urethane, silicone, or epoxy. The electromagnetic absorbing material 1460 over the mask layer 1450 may be subsequently removed leaving only the electromagnetic absorbing material 1460 over the metallization pad 1430 coupled to the stub 1420.

Figure 15:
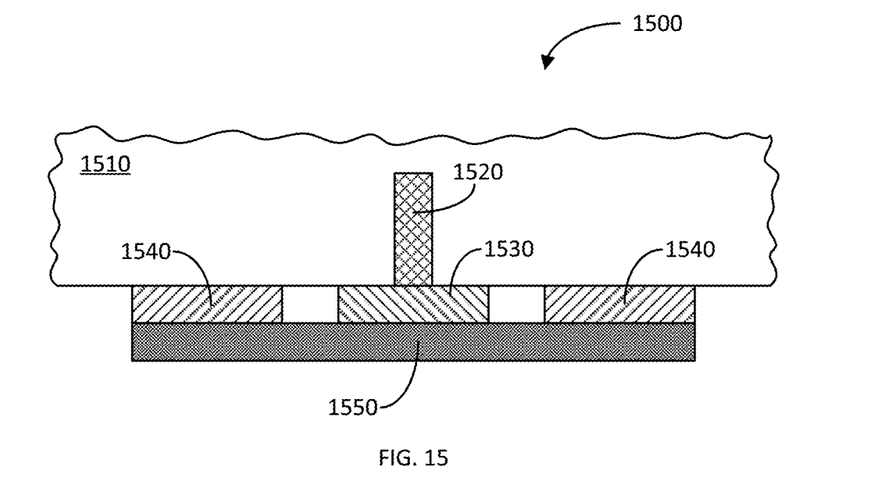
FIG. 15 illustrates a side sectional view of another exemplary printed circuit board (PCB) in accordance with another aspect of the disclosure.

FIG. 15 illustrates a side sectional view of another exemplary printed circuit board (PCB) 1500 in accordance with another aspect of the disclosure. Similarly, in this example, the PCB 1500 is undergoing a process of forming an electromagnetic absorbing material along the bottom of a via stub as discussed.

The PCB 1500 includes a set of metallization layers interposed between a set of electrically-insulating layers, which, for ease of description purposes, is represented collectively as 1510. The PCB 1500 further includes a stub 1520 extending down to a metallization pad 1530, which may be on the lowest metallization layer (e.g., M0) of the PCB 1500. Additionally, the PCB 1500 includes one or more grounded metallization pads 1540, which may also be on the lowest metallization layer (e.g., M0) of the PCB 1500.

Then, an electromagnetic absorbing material 1550 is formed over the metallization pad 1430, as well as over the ground metallization pads 1540. Similarly, the electromagnetic absorbing material 1550 may be sprayed over the bottom of the of the PCB 1500 to form the electromagnetic absorbing material over the metallization pads 1530 and 1540. For example, such sprayable electromagnetic absorbing material include urethane, silicone, or epoxy.

Figure 16:
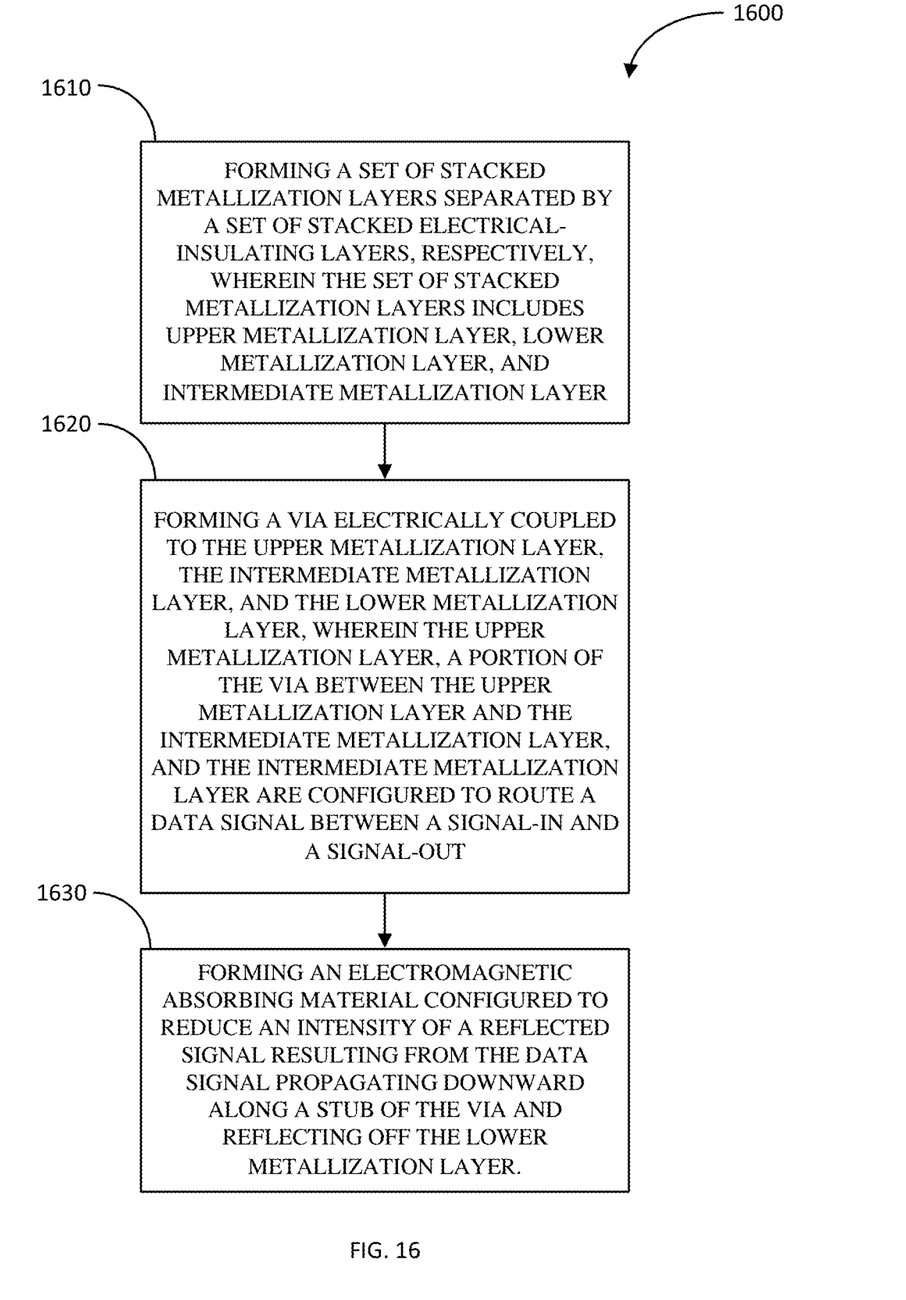
FIG. 16 illustrates a flow diagram of an exemplary method of manufacturing a printed circuit board (PCB) in accordance with another aspect of the disclosure.

FIG. 16 illustrates a flow diagram of an exemplary method 1600 of manufacturing a printed circuit board (PCB) in accordance with another aspect of the disclosure.

The method 1600 includes forming a set of stacked metallization layers separated by a set of stacked electrical-insulating layers, respectively, wherein the set of stacked metallization layers includes upper metallization layer, lower metallization layer, and intermediate metallization layer (block 1610).

The method 1600 further includes forming a via electrically coupled to the upper metallization layer, the intermediate metallization layer, and the lower metallization layer, wherein the upper metallization layer, a portion of the via between the upper metallization layer and the intermediate metallization layer, and the intermediate metallization layer are configured to route a data signal between a signal-in and a signal-out (block 1620).

Additionally, the method 1600 includes forming an electromagnetic absorbing material configured to reduce an intensity of a reflected signal resulting from the data signal propagating downward along a stub of the via and reflecting off the lower metallization layer (block 1630).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A printed circuit board (PCB), comprising:
   a set of stacked metallization layers separated by a set of stacked electrical-insulating layers, respectively, wherein the set of stacked metallization layers includes an upper metallization layer, a lower metallization layer, and an intermediate metallization layer;
   a via electrically coupled to the upper metallization layer, the intermediate metallization layer, and the lower metallization layer, wherein a stub of the via below the intermediate metallization layer produces an insertion loss notch at a particular frequency of a data signal propagating between the upper and intermediate metallization layers; and
   an electromagnetic absorbing material coupled to the stub to reduce the insertion loss notch, wherein the electromagnetic absorbing material is attached coaxially around a portion of the stub, and wherein the electromagnetic absorbing material is configured to reduce an intensity of a reflected signal resulting from the data signal propagating downward along the stub of the via and reflecting off the lower metallization layer.

2. The PCB of claim 1, wherein the upper metallization layer, a portion of the via between the upper metallization layer and the intermediate metallization layer, and the intermediate metallization layer are configured to route the data signal between a signal-in and a signal-out.

3. The PCB of claim 1, wherein the electromagnetic absorbing material is attached to the lower metallization layer directly underneath the stub.

4. The PCB of claim 1, further comprising a second electromagnetic material attached to the lower metallization layer directly underneath the stub.

5. The PCB of claim 1, further comprising a ground plane associated with the upper and intermediate metallization layers, wherein the electromagnetic absorbing material is coupled to the ground plane.

6. The PCB of claim 1, wherein the electromagnetic absorbing material has a material loss factor greater than a material loss factor of the stacked electrical insulating layers for at least a portion of a frequency spectrum of the data signal.

7. The PCB of claim 1, wherein the electromagnetic absorbing material has a dielectric constant less than a dielectric constant of the stacked electrical insulating layers for at least a portion of a frequency spectrum of the data signal.

8. The PCB of claim 1, wherein the electromagnetic absorbing material comprises urethane, silicone, or epoxy.

9. The PCB of claim 1, wherein the electromagnetic absorbing material has a material loss factor greater than one (1) at the particular frequency.

10. A printed circuit board, comprising:
    a set of stacked metallization layers separated by a set of stacked electrical-insulating layers, respectively, wherein the set of stacked metallization layers includes an upper metallization layer, a lower metallization layer, and an intermediate metallization layer;
    a via electrically coupled to the upper metallization layer, the intermediate metallization layer, and the lower metallization layer; and
    an electromagnetic absorbing material coupled to the via, wherein the electromagnetic absorbing material is configured to reduce an intensity of a reflected signal resulting from a data signal propagating downward along a stub of the via and reflecting off the lower metallization layer, wherein the electromagnetic absorbing material is attached to a dielectric material situated between the lower metallization layer and the electromagnetic absorbing material directly underneath the stub, wherein a dielectric constant of the dielectric material is between a dielectric constant of the stacked electrical insulating layers and a dielectric constant of the electromagnetic absorbing material.

11. The printed circuit board of claim 10, wherein the electromagnetic absorbing material has a material loss factor greater than a material loss factor of the stacked electrical insulating layers for at least a portion of a frequency spectrum of the data signal.

12. The printed circuit board of claim 10, wherein the dielectric constant of the electromagnetic absorbing material is less than the dielectric constant less of the stacked electrical insulating layers for at least a portion of a frequency spectrum of the data signal.

13. The printed circuit board of claim 10, wherein the electromagnetic absorbing material comprises urethane, silicone, or epoxy.

14. The printed circuit board of claim 10, further comprising a second electromagnetic absorbing material attached coaxially around a portion of the stub.

15. The printed circuit board of claim 10, wherein the upper metallization layer, a portion of the via between the upper metallization layer and the intermediate metallization layer, and the intermediate metallization layer are configured to route the data signal between a signal-in and a signal-out.

16. A printed circuit board, comprising:
    a set of stacked metallization layers separated by a set of stacked electrical-insulating layers, respectively, wherein the set of stacked metallization layers includes an upper metallization layer, a lower metallization layer, and an intermediate metallization layer;
    a via electrically coupled to the upper metallization layer, the intermediate metallization layer, and the lower metallization layer;
    an electromagnetic absorbing material coupled to the via, wherein the electromagnetic absorbing material configured to reduce an intensity of a reflected signal resulting from a data signal propagating downward along a stub of the via and reflecting off the lower metallization layer; and
    a second electromagnetic absorbing material attached to a dielectric material situated between the lower metallization layer and the second electromagnetic absorbing material directly underneath the stub, wherein a dielectric constant of the dielectric material is between a dielectric constant of the stacked electrical insulating layers and a dielectric constant of the electromagnetic absorbing material.

17. The printed circuit board of claim 16, wherein at least one of the electromagnetic absorbing material or the second electromagnetic absorbing material has a material loss factor greater than a material loss factor of the stacked electrical insulating layers for at least a portion of a frequency spectrum of the data signal.

18. The printed circuit board of claim 16, wherein at least one of the dielectric constant of the electromagnetic absorbing material or a dielectric constant of the second electromagnetic absorbing material is less than the dielectric constant less of the stacked electrical insulating layers for at least a portion of a frequency spectrum of the data signal.

19. The printed circuit board of claim 16, wherein at least one of the electromagnetic absorbing material or the second electromagnetic absorbing material comprises urethane, silicone, or epoxy.

20. The printed circuit board of claim 16, wherein the electromagnetic absorbing material is attached coaxially around a portion of the stub.

21. The printed circuit board of claim 16, wherein the upper metallization layer, a portion of the via between the upper metallization layer and the intermediate metallization layer, and the intermediate metallization layer are configured to route the data signal between a signal-in and a signal-out.

22. An apparatus, comprising:
a first device configured to generate a data signal;
a second device configured to receive the data signal; and
a printed circuit board (PCB), comprising:
a set of stacked metallization layers separated by a set of stacked electrical-insulating layers, respectively, wherein the set of stacked metallization layers includes an upper metallization layer, a lower metallization layer, and an intermediate metallization layer;
a via electrically coupled to the upper metallization layer, the intermediate metallization layer, and the lower metallization layer, wherein the upper metallization layer, a portion of the via between the upper metallization layer and the intermediate metallization layer, and the intermediate metallization layer are configured to route the data signal from the first device to the second device, wherein a stub of the via below the intermediate metallization layer produces an insertion loss notch at a particular frequency of the data signal; and
an electromagnetic absorbing material configured to reduce the insertion loss notch, wherein the electromagnetic absorbing material is attached coaxially around a portion of the stub, and wherein the electromagnetic absorbing material is configured to reduce an intensity of a reflected signal resulting from the data signal propagating downward along the stub of the via and reflecting off the lower metallization layer.

23. The apparatus of claim 22, wherein the electromagnetic absorbing material comprises a polystyrene material.

24. The apparatus of claim 22, wherein the electromagnetic absorbing material has a material loss factor greater than one (1) at the particular frequency.

* * * * *